(12) United States Patent
Lee et al.

(10) Patent No.: US 9,293,935 B2
(45) Date of Patent: Mar. 22, 2016

(54) WIRELESS BATTERY AREA NETWORK FOR A SMART BATTERY MANAGEMENT SYSTEM

(75) Inventors: Jaesik Lee, Basking Ridge, NJ (US); Inseop Lee, Pittstown, NJ (US); Minkyu Lee, Ringoes, NJ (US); Andrew M. Chon, Princeton, NJ (US)

(73) Assignee: Navitas Solutions, Inc., Hillsborough, NJ (US)

( * ) Notice: Subject to any disclaimer, the term of this patent is extended or adjusted under 35 U.S.C. 154(b) by 199 days.

(21) Appl. No.: 13/881,190

(22) PCT Filed: Oct. 31, 2011

(86) PCT No.: PCT/US2011/058503
§ 371 (c)(1),
(2), (4) Date: Jun. 7, 2013

(87) PCT Pub. No.: WO2012/061262
PCT Pub. Date: May 10, 2012

(65) Prior Publication Data
US 2013/0271072 A1    Oct. 17, 2013

Related U.S. Application Data

(60) Provisional application No. 61/409,290, filed on Nov. 2, 2010.

(51) Int. Cl.
*H02J 7/00* (2006.01)
*H01M 10/42* (2006.01)
(Continued)

(52) U.S. Cl.
CPC ......... *H02J 7/0057* (2013.01); *H01M 10/4207* (2013.01); *H01M 10/441* (2013.01);
(Continued)

(58) Field of Classification Search
CPC ........ H02J 7/025; H01F 38/14; Y02T 90/122; B60L 11/182; Y02E 60/12
USPC .......................................................... 320/108
See application file for complete search history.

(56) References Cited

U.S. PATENT DOCUMENTS

| | | | |
|---|---|---|---|
| 5,602,460 | A | 2/1997 | Fernandez et al. |
| 5,631,537 | A | 5/1997 | Armstrong |

(Continued)

FOREIGN PATENT DOCUMENTS

| | | | |
|---|---|---|---|
| CN | 1333962 | A | 1/2002 |
| CN | 1512644 | A | 7/2004 |

(Continued)

OTHER PUBLICATIONS

Office Action issued Jun. 9, 2015 in Japanese Patent Application No. 2013-536902 and English translation (10 pages).

(Continued)

*Primary Examiner* — Arun Williams
(74) *Attorney, Agent, or Firm* — Fox Rothschild, LLP; Robert J. Sacco

(57) ABSTRACT

A Wireless battery area network permits the wirelessly monitoring and controlling of individual batteries within large-scale battery applications. The system automatically configures its wireless nodes in the network and provides for the linking of a plurality of batteries (10) to a master battery management unit (M-BMU) (100) by establishing a wireless battery area network within a battery pack that include slave units (S-BMU) (210). The entire system may also be controlled by a top level battery management unit (T-BMU) (510). The system and method allows for the monitoring of voltage, current, temperature, or impedance of individual batteries and for the balancing or bypassing of a battery.

14 Claims, 11 Drawing Sheets

(51) Int. Cl.
*H01M 10/44* (2006.01)
*H01M 10/46* (2006.01)
*H04Q 9/00* (2006.01)
*G01R 31/36* (2006.01)

(52) U.S. Cl.
CPC ............ *H01M10/46* (2013.01); *H02J 7/0021* (2013.01); *H04Q 9/00* (2013.01); *G01R 31/3689* (2013.01); *H04Q 2209/43* (2013.01); *H04Q 2209/47* (2013.01)

(56) References Cited

U.S. PATENT DOCUMENTS

| | | |
|---|---|---|
| 5,646,508 A | 7/1997 | van Phuoc et al. |
| 5,963,019 A | 10/1999 | Cheon |
| 6,351,097 B1 | 2/2002 | Oh |
| 7,042,352 B2 | 5/2006 | Kates |
| 7,598,880 B2 | 10/2009 | Powell et al. |
| 7,619,417 B2 | 11/2009 | Klang |
| 7,710,073 B2 | 5/2010 | Yamauchi et al. |
| 7,774,151 B2 | 8/2010 | Bertness |
| 7,888,912 B2 | 2/2011 | Morita et al. |
| 8,022,669 B2 | 9/2011 | Li |
| 2001/0031015 A1 | 10/2001 | West et al. |
| 2005/0242775 A1* | 11/2005 | Miyazaki et al. ............ 320/116 |
| 2005/0275527 A1 | 12/2005 | Kates |
| 2006/0041680 A1* | 2/2006 | Proctor, Jr. et al. .......... 709/238 |
| 2006/0152190 A1 | 7/2006 | Riemschneider |
| 2006/0192434 A1 | 8/2006 | Vrla et al. |
| 2007/0029972 A1 | 2/2007 | Lampe-Onnerud et al. |
| 2008/0049653 A1 | 2/2008 | Demirhan et al. |
| 2009/0066291 A1 | 3/2009 | Tien et al. |
| 2009/0184685 A1* | 7/2009 | Sim et al. ...................... 320/134 |
| 2010/0019732 A1 | 1/2010 | Utsumi et al. |
| 2010/0052615 A1 | 3/2010 | Loncarevic |
| 2011/0115430 A1* | 5/2011 | Saunamaki ................... 320/108 |

FOREIGN PATENT DOCUMENTS

| | | |
|---|---|---|
| CN | 101740827 A | 6/2010 |
| JP | H09-7640 A | 1/1997 |
| JP | 2002-272010 A | 9/2002 |
| JP | 2003-304646 A | 10/2003 |
| JP | 2004-120871 A | 4/2004 |
| JP | 2006-108755 A | 4/2006 |
| JP | 2008-198434 A | 8/2008 |
| JP | 2010-081716 A | 4/2010 |
| WO | 2006068429 A1 | 6/2006 |

OTHER PUBLICATIONS

Information about Related Patents and Patent Applications, see section 6 of the accompanying Information Disclosure Statement Letter, which concerns Related Patents and Patent Applications.
International Preliminary Report on Patentability for Application No. PCT/US2011/058503 dated May 7, 2013.
PCT—International Search Report—Dated Feb. 16, 2012—2 Pages.
PCT—Written Opinion of the ISA—Dated Feb. 16, 2012—7 Pages.

* cited by examiner

WIRELESS BATTERY AREA NETWORK FOR A SMART BATTERY MANAGEMENT SYSTEM

CROSS-REFERENCE TO RELATED APPLICATIONS

This application is the National Phase filing of PCT Application No. PCT/US2011/058503 filed Oct. 31, 2011 and claims priority to U.S. Provisional Application No. 61/409,290, the disclosure of which is hereby incorporated by reference in its entirety.

BACKGROUND OF THE INVENTION

1. Field of the Invention

The invention relates to a battery management system including a plurality of battery cells in a battery pack in which a wireless battery area network is automatically established between a base station (M-BMU) and a plurality of slave battery cell sensor nodes (S-BMU).

2. Description of Related Art

Lithium-ion (Li-ion) batteries are growing in popularity as energy storage reservoirs for industrial and automotive applications, high-voltage energy uses (smart grid), such as wind turbines, photo-voltaic cells, and hybrid electric vehicles, and this has spurred demand for safer, higher performing battery monitoring and protection systems. Compared to NiMH (nickel-metal hydride) battery management systems, see, for example, US. Pat. No. 6,351,097, Li-ion batteries have better energy-to-weight ratio, offer more efficient storage capacity over multiple charge-discharge cycles, and suffer less charge leakage when not in use. Unlike NiMH batteries traditionally used in high-voltage applications, battery stacks using Li-Ion technology can comprise a large number of individual cells totaling hundreds of cells at different voltages. Each cell must be properly monitored and balanced to ensure user safety, improve battery performance and extend battery life. Therefore, the battery management system (BMS) is one of critical components for small and large-scaled battery applications. Examples of Li-ion battery packs are disclosed in U.S. Pat. Nos. 5,602,460; 5,631,537; and 5,646,508. The main objectives of a BMS are: (1) to guarantee appropriate use of the battery, (2) to guarantee maximum performance of the battery, (3) to monitor necessary battery state data, and (4) to permit diagnosis. The BMS architecture should overcome the three major hurdles of state-of-the-art Li-Ion batteries: life cycle, cost and scalability. For example, in Smart Grid and power plant applications, the battery capacity needs to be as large as a few hundred kWh to a few MWh. However, current BMS architecture is not scalable to handle such a large number of battery cells. More importantly, the complexity and cost of wire harnesses for handling large-scaled battery applications is often not acceptable. Also, conventional battery management systems require data bus isolators such as an opto-coupler based vertical bus, and suffer from high cost and high power consumption. Most research efforts have been focused on improving the cell chemistry aspects. Considering that roughly 30% of the cost of a battery pack is for the BMS and the percentage increases as the battery capacity becomes larger, BMS can be a source of significant cost reduction especially for large-scale Li-Ion battery packs. Very few prior art battery management systems use wireless communication, instead of wired media, or a combination of wired and wireless.

U.S. Pat. No. 6,351,097 describes a battery management system for Ni—Cd and NiMH, while the following U.S. Patents discuss possibly relevant battery management systems for Li-Ion or Li-Polymer batteries: U.S. Pat. Nos. 5,963,019; 7,619,417; 7,888,912; 8,022,669; and US 2007/0029972. A useful discussion of secondary battery reuse and protection is found in U.S. Pat. No. 7,710,073.

Lastly, the following U.S. Patents are cited for their useful discussions of the current state-of-the-art of wireless communication in battery management systems: U.S. Pat. Nos. 7,598,880; 7,774,151; and US 2006/0152190.

SUMMARY OF THE INVENTION

A system and method is disclosed for smartly monitoring and controlling individual batteries within a large-scaled battery application. The system can link a plurality of batteries to a master battery management unit (M-BMU) by establishing a wireless battery area network within a battery pack. The method can include the monitoring of individual battery operations for the voltage, current, temperature, or impedance, and the control of its operation by balancing or bypassing the battery. The monitoring and control of each battery operation is preferably performed by a slave battery management unit (S-BMU) that is mounted directly on each battery cell. State-of-charge (SoC) and state-of-health (SoH) algorithms are executed at the M-BMU. The data protocol for monitoring and controlling cells is transmitted between the S-BMUs and the M-BMU at a predefined periodic rate. Such a wireless battery area network can easily provide the scalability for large-scaled battery applications. In addition, a wireless battery area network can accurately configure battery operation directly for a corresponding battery cell, thus extending the battery pack's life cycle.

The invention will be further understood by reference to the following drawings.

DETAILED DESCRIPTION OF THE INVENTION

During the course of this description, like numbers will be used to identify like elements according to the different figures which illustrate the invention.

In general, all Battery Management Systems (BMS) are implemented using an electronic circuit board. The BMS monitors the voltage, the current, impedance, and the temperature of each cell. Since a BMS has to monitor each and every Li-Ion battery cell, the typical prior art BMS board needs to be wired to every Li-Ion cell. This can be a problem if the number of Li-Ion battery cells to be monitored needs to increase. According to the prior art, hierarchical BMS architectures are often used, however, the use of BMS architectures also calls for an increase in the number of BMS boards and the overall cost. When the number of Li-Ion cells increases to a few hundred, or up to thousands, which is often the case for electric vehicle (EV) or power plant applications, the wire harness becomes a serious problem. Thus, one of the biggest issues of BMS implementation is wiring. To reduce this issue, a star topology, a ring topology, or a daisy chain topology have been introduced. These topologies may reduce wiring problems, but they cause optimization problems because all batteries are not configurable. For the best optimization of battery life and performance, it is ideal to control individual batteries.

Figure 1:
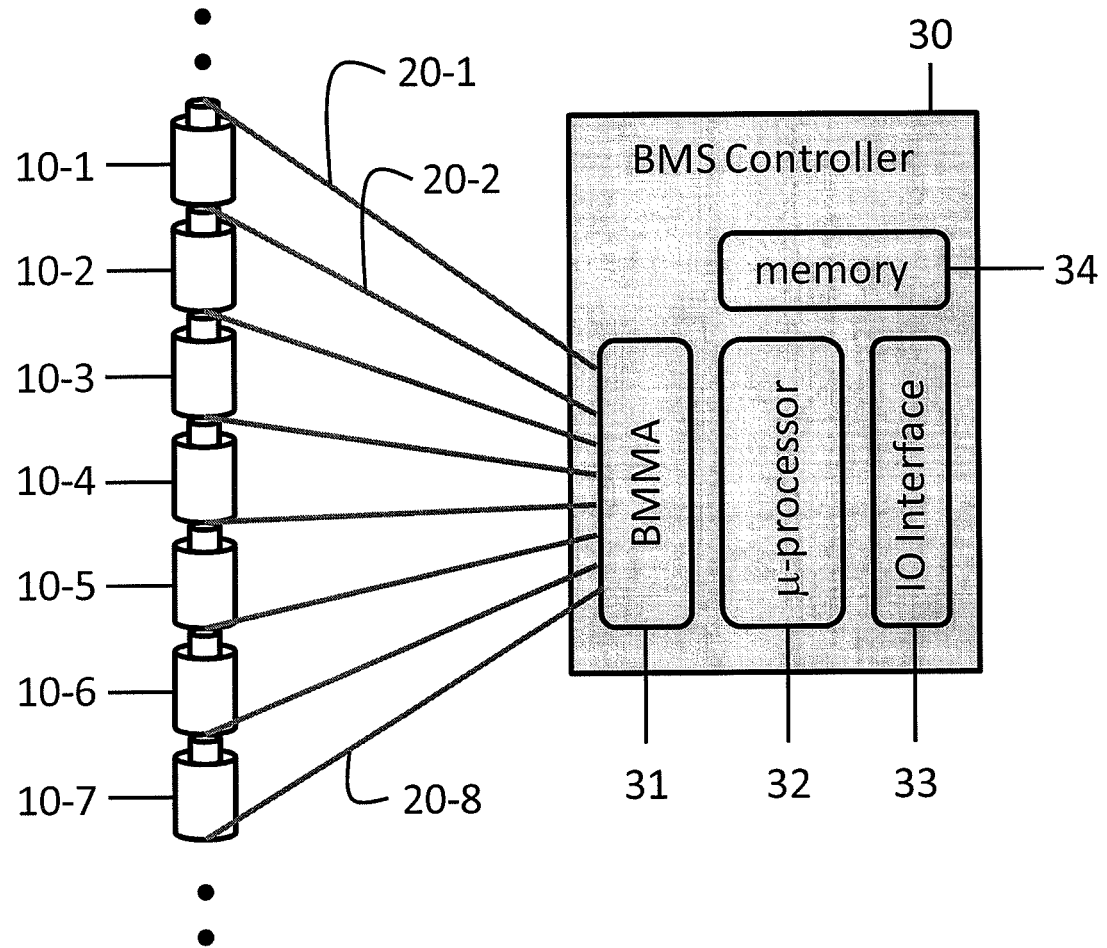
FIG. 1 is a centralized BMS topology schematically illustrating a portion of the architecture of a conventional prior art battery management system.

FIG. 1. shows a fully centralized prior art wired BMS architecture according to the prior art. Each BMS Controller (30) includes a μ-Processor (32), an IO Interface (33) a memory (34) and a BMA (35). This is the simplest architecture where there is a single BMS controller board (30) and wires (20-1, . . . , 20-8) are connected to each of the battery cells (10-1, . . . , 10-7). However, the wiring can be a problem for a large capacity or high voltage battery pack. For example, a battery pack with 100 cells in series must have 101 wires running between the cells (10) and a centralized BMS (30). All of those wires (20) can be hard to route. Worse, the more wires there are in a battery (10), the greater the risk that one of them will become the path for a plasma discharge between the two poles of the battery (10).

Figure 2:
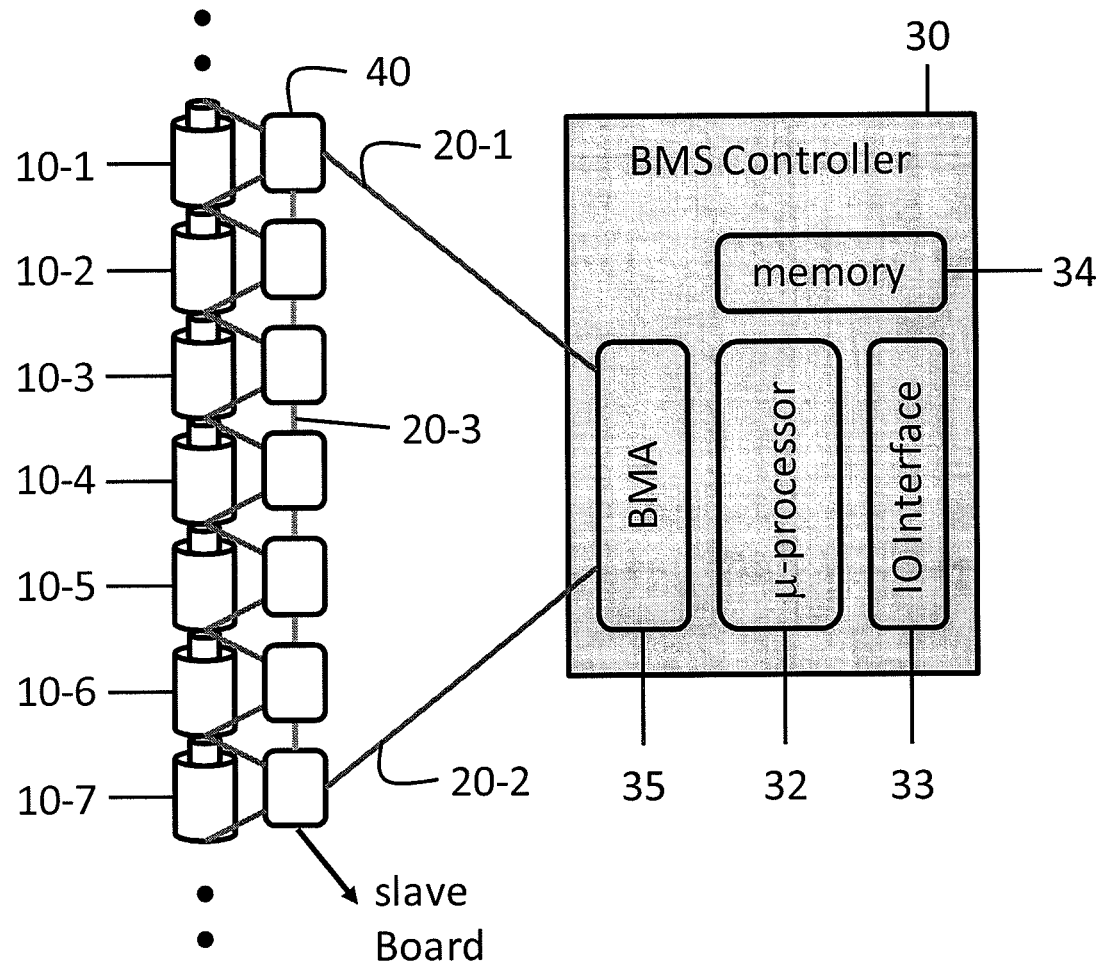
FIG. 2 is a distributed BMS topology schematically illustrating a portion of the architecture of a conventional prior art battery management system showing the use of slave units.

FIG. 2. shows another prior art fully distributed architecture where BMS boards (40) are mounted on battery cells (10), and the BMS boards (40) are connected together in a single daisy chain (20-1, 20-2, 20-3) to the central BMS controller (30). The wiring problem is resolved in this topology but a single BMS board (40) failure will lead to an entire battery pack failure and measurement time is proportionally increased with the number of stacked batteries (10).

Figure 3:
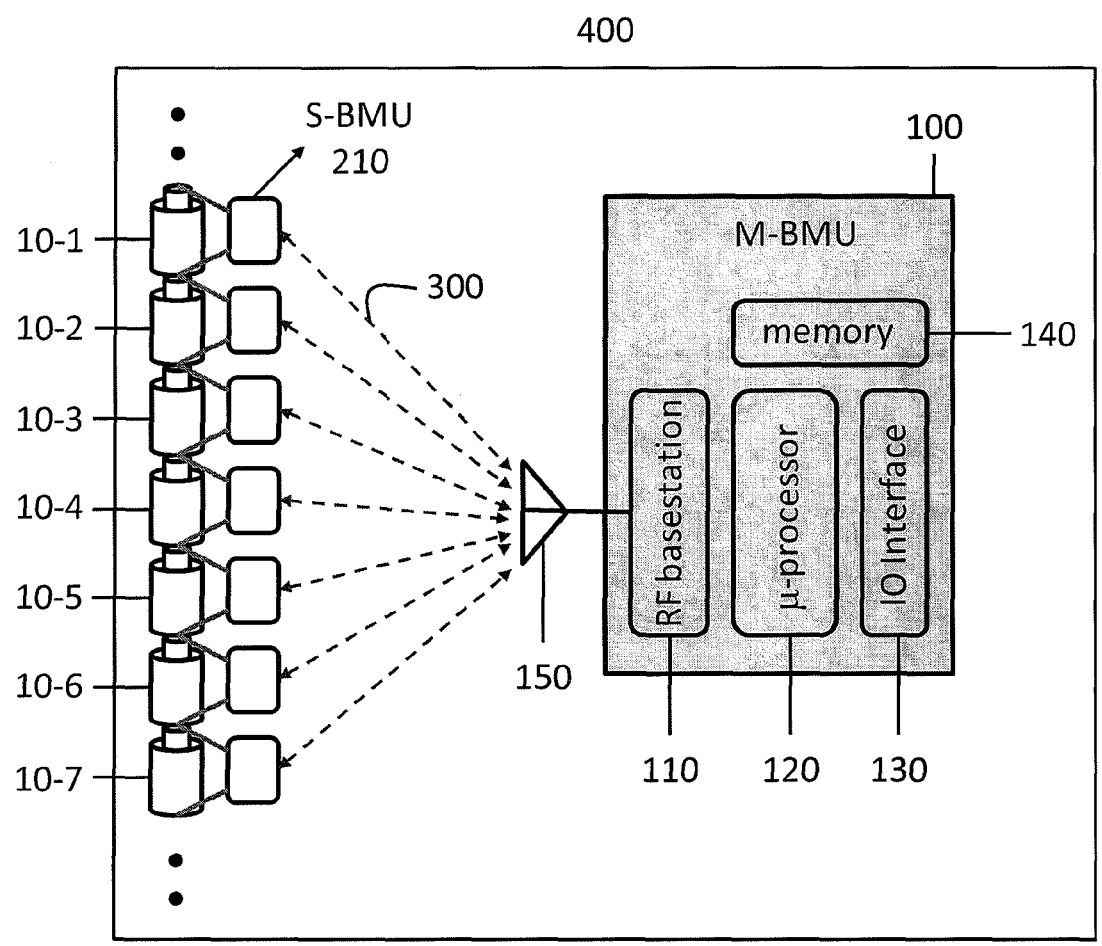
FIG. 3 illustrates the method and system topology of a wireless battery area network (WiBaAN) according to the preferred embodiment of the present invention.

FIG. 3. illustrates the proposed wireless battery area network (WiBaAN) according to the preferred embodiment of the invention where a slave battery management unit (S-BMU) (210) mounted on each battery cell (10) is wirelessly (300) connected to a single master battery management unit (M-BMU) (100). The proposed architecture has major advantages over all conventional prior art BMS architectures.

The WiBaAN (400) consists of a single M-BMU (100) (for a large battery pack size with less than 500 battery cells) and a plurality of S-BMUs (200) for individual battery cell (10). Each M-BMU (100) includes an RF radio (110), antenna (150), microprocessor (120), memory (140), and various interfaces (130). Alternatively, the RF radio (110), microprocessor (120), and parts of memory (140), power management unit, and interfaces (130) can be integrated on a single silicon chip or die. Each S-BMU (210) includes analog sensors (240), an RF radio (220), on-board antenna (230), and battery control logic (250). Alternatively, the analog sensors (240), RF radio (220), and battery control logic (250) can be implemented on a single silicon chip. The smart BMS (400) incorporated with the WiBaAN is able to communicate with each individual battery cell (10) and monitor actual operating conditions such as its voltage, current, impedance, and ambient temperature. It is an essential part of the BMS (400) to monitor individual battery cell (10) conditions. Effective communication bandwidth in the WiBaAN is entirely dependent on the size of battery pack (10) (i.e. the number of batteries in a pack) and the system refresh rate (i.e., CAN-bus update rate in EV) of the applications. The WiBaAN provides easy interface between individual battery cells (S-BMU) (210) and a BMS controller (M-BMU) (100), and offers flexible expansion of the effective communication bandwidth by adding more packs and performing the reconfiguration of the wireless interface. Information concerning the operating condition of individual battery cells (10) in real time is incorporated with information about the battery specifications from the manufacturer and allows the system to control the state of charge (SoC) and tolerance conditions of each battery cell (10) and to ultimately prolong battery life or increase battery cycle time or both. In addition, it allows the BMS to intelligently equalize cell balancing (251) in a cell pack (10) so that it can significantly reduce the cell balancing time. Since a wireless link inherently provides voltage-independent data transmission, then the WiBaAN does not require isolators for the communicating of data between S-BMUs (200) and an M-BMU (100).

The sheer numbers of inaccessible and unattended S-BMUs (210), which are prone to frequent failures, make topology maintenance a challenging task. Hundreds to thousands of S-BMUs (200) can be deployed throughout a WiBaAN field (500). They are generally deployed within ten feet of each other, so that node densities may be as high as 100 S-BMUs/m$^3$, or even higher. Deploying a high number of densely packed nodes requires careful handling and special topology maintenance. However, while device failure is a regular or common event due to energy depletion or destruction in wireless sensor nodes, the S-BMUs (200) within the WiBaAN (500) rarely fail due to directly supplied power by the mounted battery. Since it is challenging to have highly mobile nodes in any WiBaAN application, WiBaAN does not usually experience varying task dynamics. In addition, it is not a good target for deliberate jamming. The disclosed WiBaAN topology is not prone to frequency changes after deployment.

Figure 4:
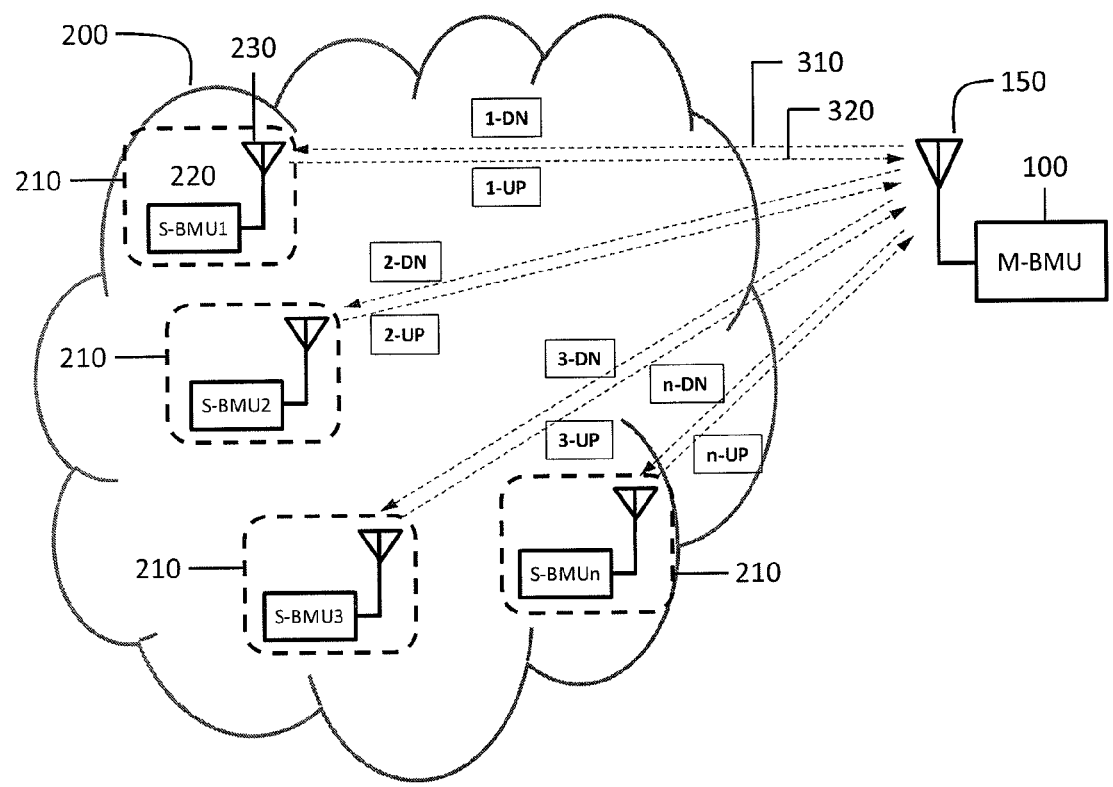
FIG. 4 illustrates the wireless access method of the present invention which discloses a time division half-duplex method for accessing S-BMU nodes based on a predetermined period and sequence in a WiBaAN.

WiBaAN can be a duplex wireless communication system, but FIG. 4. depicts a half-duplex system as one of the preferred possible WiBaAN topologies. The WiBaAN consists of one node with a single point-to-point link to a second node. The choice of which central node is the M-BMU (100) and the other nodes are the S-BMUs (200). The network may use non-broadcast multi-access communications, where the M-BMU (100) of the network only addresses individual S-BMUs (210) with each communication. The WiBaAN contains 'n' number of S-BMUs (200) and a single M-BMU (100) as a hub. The maximum number of 'n' in a WiBaAN can be determined by considering the communication packet size, the effective WiBaAN bandwidth, and the required system refresh rate. Given the example of an electric vehicle (EV), it is assumed that the packet size of the down-/upstream data is PS-bit, the WiBaAN maximum data rate is DR-bit/second, and CAN-bus refresh rate is RR-seconds, then the maximum number of S-BMUs (200) in a WiBaAN domain should be less than DR*RR/PS.

Figure 5:
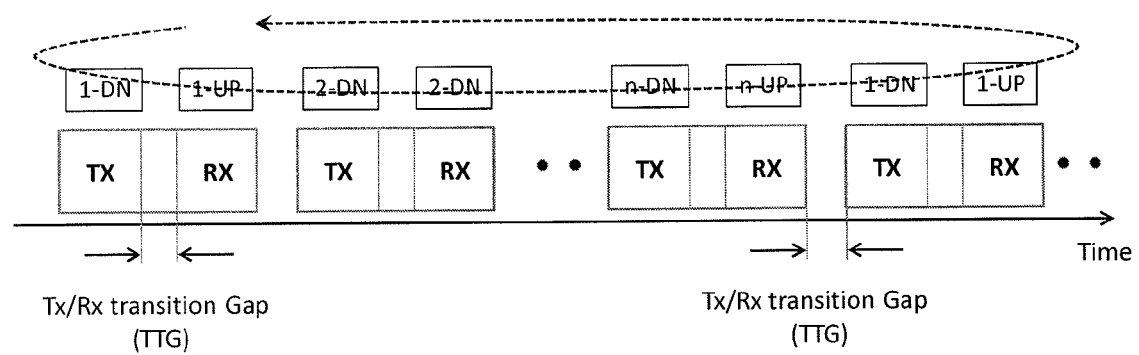
FIG. 5 is a timing diagram illustrating communication between S-BMUs and an M-BMU in a WiBaAN.

FIG. 5. illustrates a data transmission (access) method based on an established time division multiplex protocol (TDM) to communicate between an M-BMU (100) and a number of S-BMUs (200) within a WiBaAN. TDM has an advantage in WiBaAN because there is an asymmetry between the uplink and downlink data rates, and the uplink and downlink paths are likely to be very similar. TDM uses a single frequency spectrum to transmit signals in both downstream and upstream directions. The TDM system requires a guard time between transmit (downlink) and receive (uplink) streams. The Tx/Rx transition gap (TTG) is a gap between downlink and uplink transmission. This gap allows time for the M-BMU (100) to switch from transmit mode to receive mode and the S-BMUs (210) to switch from receive mode to transmit mode.

Figure 6:
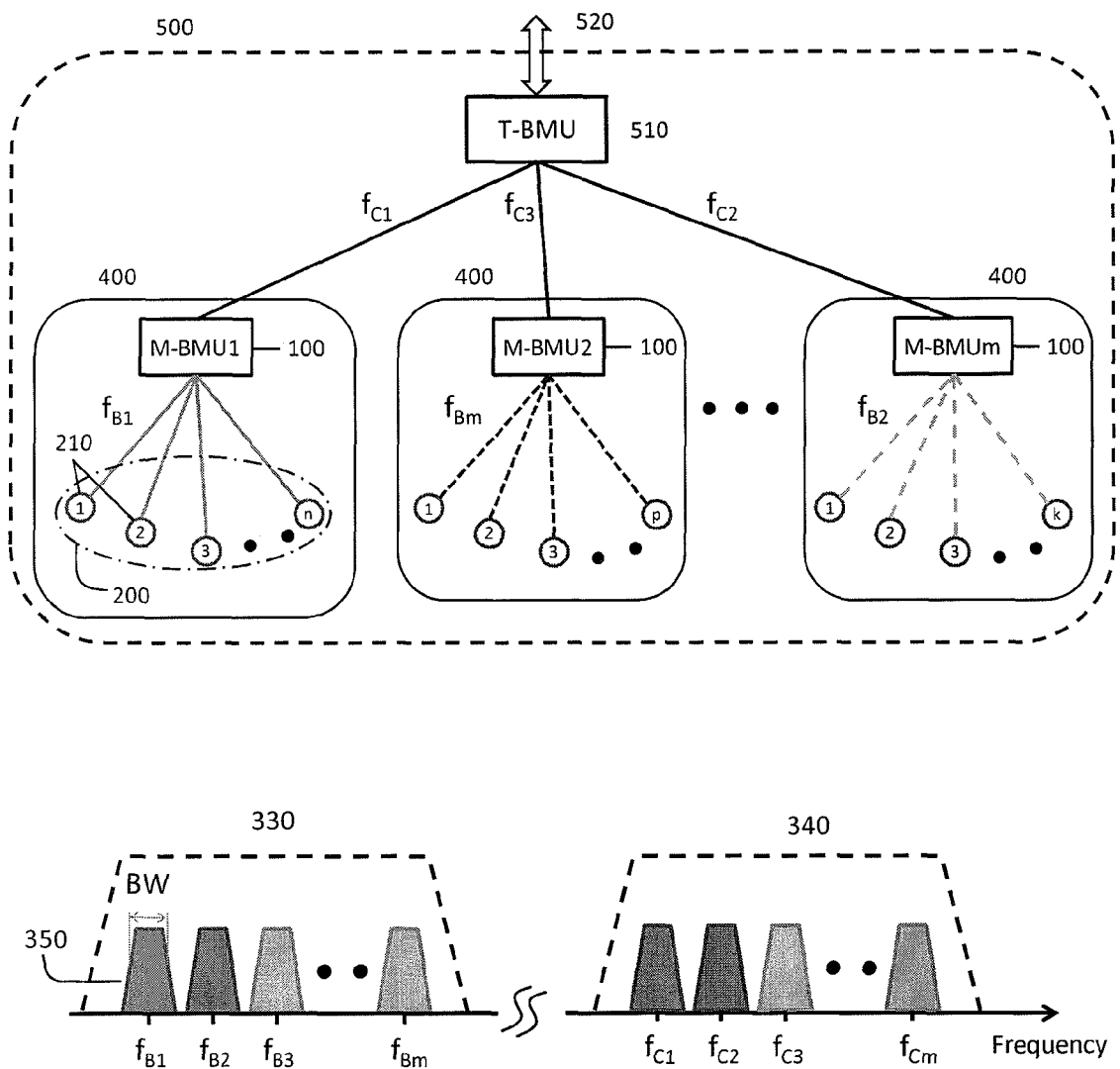
FIG. 6 illustrates the hierarchical architecture of a WiBaAN based on a hybrid multiplexing communication network in which the WiBaAN consists of several battery banks and in which a battery bank comprises one M-BMU and a plurality of S-BMUs, for large-scale battery applications.

FIG. 6. depicts a hierarchical WiBaAN architecture (500) based on a hybrid multiplexing communication network. It consists of three different levels of battery controllers: T-BMU (510), M-BMUs (100), and S-BMUs (200). A single top-level battery management unit (T-BMU) (510) is the top level node of the battery management system (500), and includes RF radio, antenna, microprocessor, controller, peripheral interface units, and power management units similar to the M-BMUs (100). T-BMU (510) controls multiple M-BMUs' (100) operations, collects the data from the M-BMUs (100), and communicates with a main system through external interfaces (520) such as a controller area network (CAN or CAN-bus) (520). The wireless communication network between a T-BMU (510) and multiple M-BMUs (100) is preferably established by frequency division multiplexing (FDM) techniques in which each channel uses a different carrier frequency signal ($f_{Ci}$) (340). Each higher node of the architecture operates with a longer interval of control and execution time than its immediately lower layer. Each branch is organized with an M-BMU (100) and a number of S-BMUs (200) forming a battery management 'bank' (400). Each bank (400) establishes a FDM network ($f_{Bi}$) (330) with adjacent battery management banks so as to suppress the interference between adjacent RF communications, whereas time division multiplexing (TDM) is used to communicate between each M-BMU (100) and a plurality of S-BMUs (200) within a battery management bank, as shown in FIG. 5. The size of a battery management bank is determined by parameters such as the number of S-BMUs (200), data rate, specification of update battery data rate, etc. For example, if there is a limited number of S-BMUs (200), for example less than 700, with a data rate of 1 Mb/s at 100 msec update data rate we will see the following. In that condition, only one battery bank would be needed to manage all the WiBaAN entities, and an M-BMU (100) can calculate each S-BMU's (200) SoC/SoH and control whole entities based on their monitoring data. If the entire system included more than one battery bank and requires a hierarchical architecture, as shown in FIG. 6, then each M-BMU (100) includes a microprocessor to calculate the SoC/SoH for each S-BMUs in a battery bank, and transfers SoC/SoH data to the T-BMU (510) to control BMS operations. Otherwise, that T-BMU can calculate all the S-BMU's SoC/SoH with microprocessors, in which case the M-BMUs (100) play the role of data transfer gateway.

Figure 7:
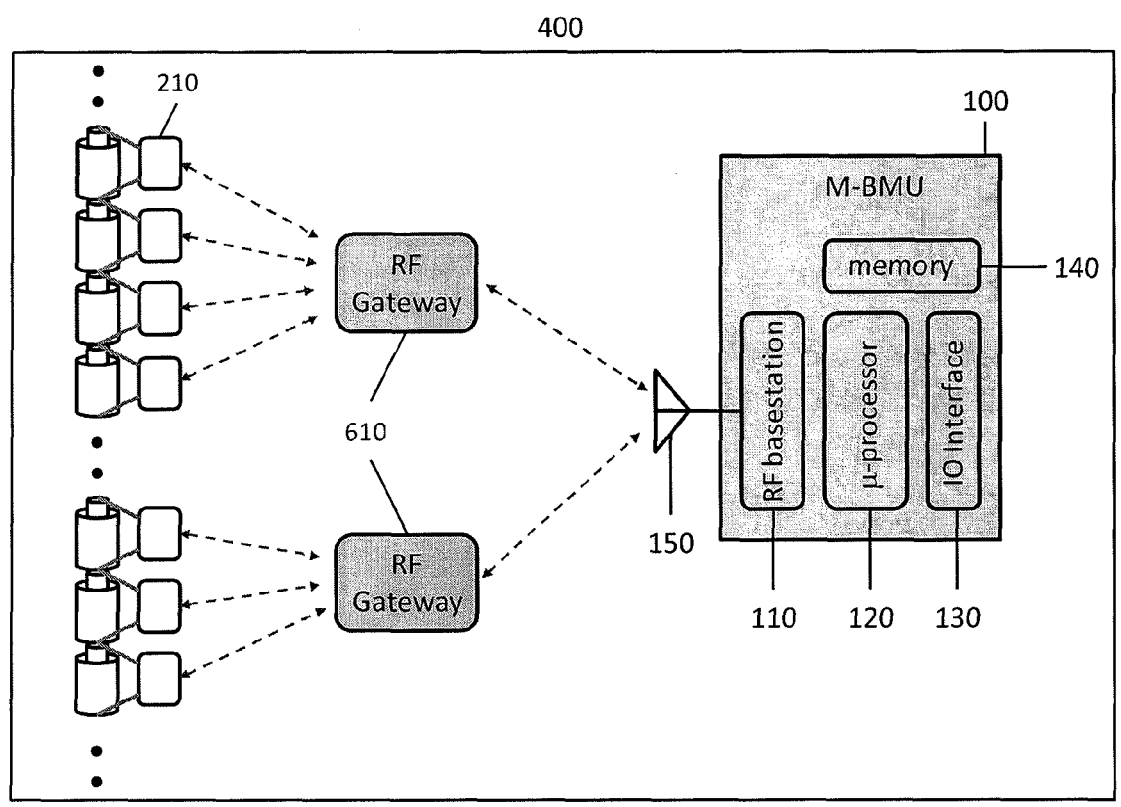
FIG. 7 illustrates an alternative embodiment of the present invention employing RF repeaters.

FIG. 7. shows a modified and practical topology for a WiBaAN in which a network (400) has one or more wireless repeaters (or RF gateways) (610) between the M-BMU (100) and the peripheral S-BMU nodes (200). The RF gateways (610) are used to extend the maximum transmission distance of the point-to-point links between the M-BMU (100) and the S-BMU nodes (210) beyond that which is supported by the transmitter power of the M-BMU (100) or beyond that which is supported by the physical package upon where the WiBaAN is deployed.

Figure 8:
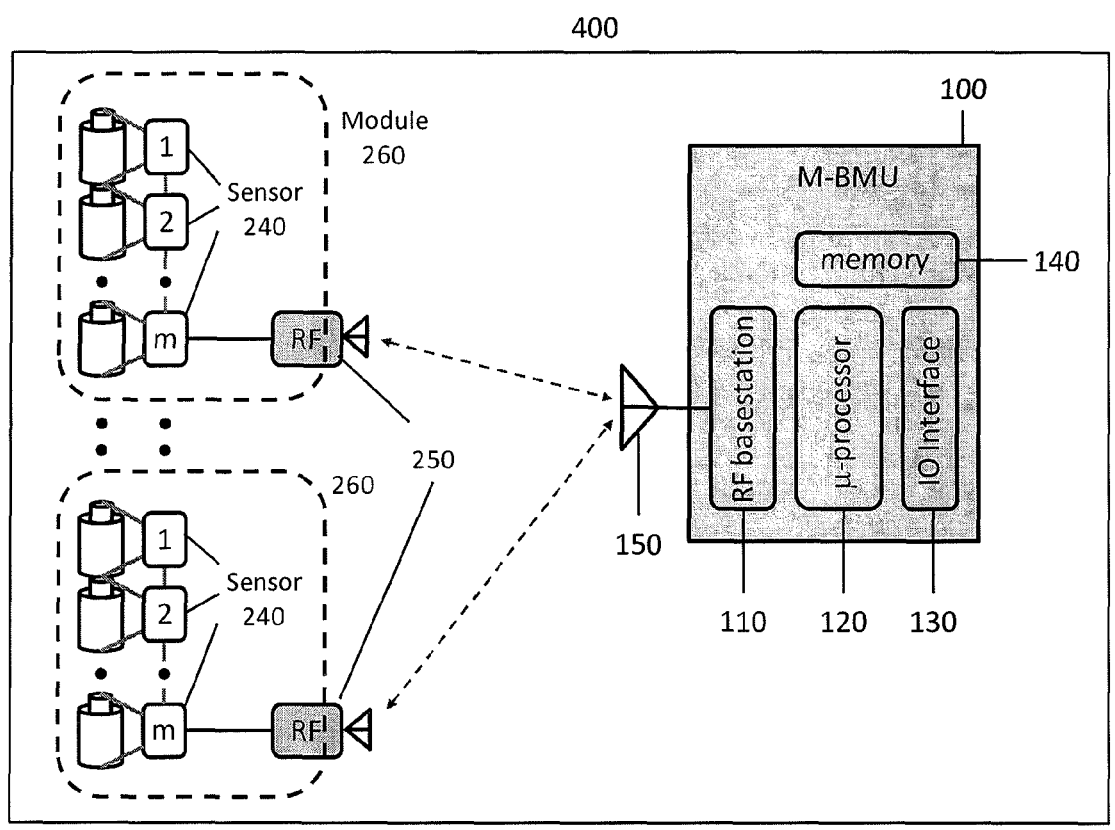
FIG. 8 illustrates another alternative embodiment of the present invention employing sensors connected to the battery pack.

FIG. 8. illustrates another alternative embodiment of a modified WiBaAN topology in which a physical sensor unit (240) is mounted on a battery cell (10) and the cells (10) can be stacked up to a predetermined number (m) of battery cells (10) in one string. Two sets of serial ports on a sensor unit (240) enable the sensor units (240) to be daisy chained or connected by other digital interfaces like CAN. Communication with the M-BMU (100) is carried out on the lowest level through a RF radio (250). This topology can be used to simplify wireless communication links and reduce the number of required RF radios. It may be also useful to overcome the physical complexity of battery pack structures in which the modularization (260) of a battery pack (400) is developed.

Figure 9A:
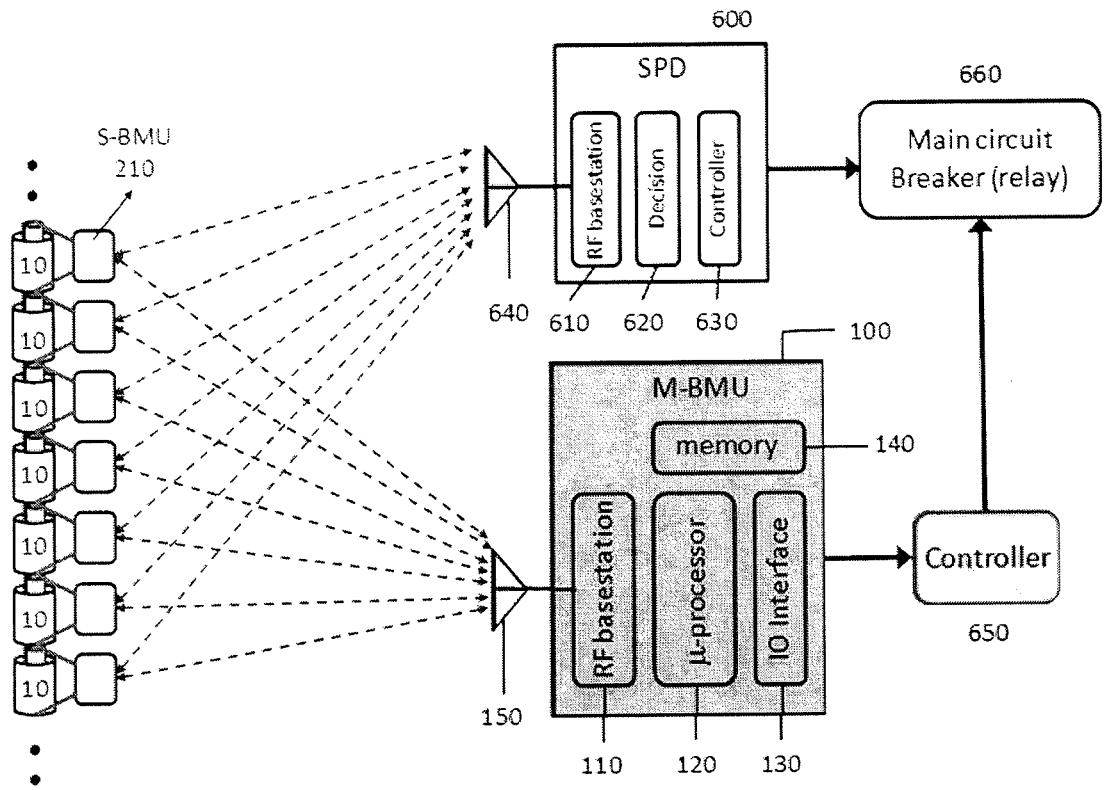
FIG. 9(a) illustrates a secondary battery protection device in the context of a WiBaAN.
Figure 9B:
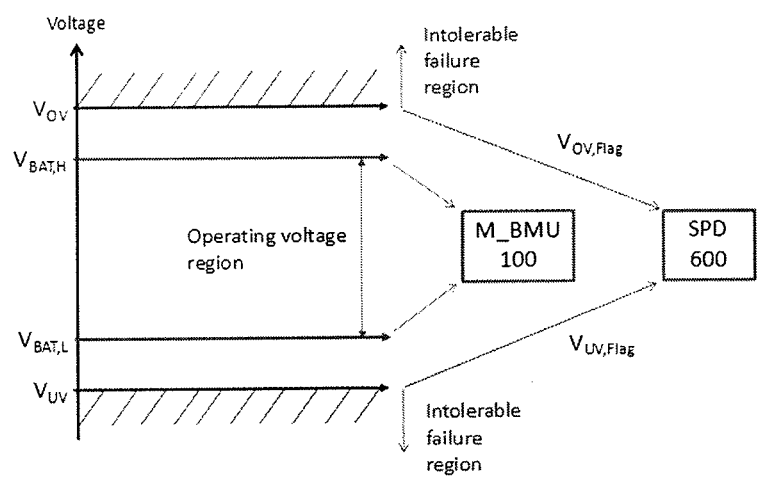
FIG. 9(b) is a voltage diagram illustrating the voltage range where the M-BMU normally operates and also the failure region where the SPD takes over control.

FIG. 9($a$) is a block diagram of a wireless secondary battery protection (SPD) scheme for a BMS (100). Secondary protection refers to a mechanism for protecting a battery pack when the primary protection mechanism through battery management system (BMS) (100) fails to operate. In order to achieve secondary protection, the voltage and temperature of each cell in a battery pack (10) needs to be monitored. When the operating condition is out of the safe zone, an appropriate fault signal is delivered to the protection circuit, which operates independently of the main BMS or controlling microprocessor. In a WiBaAN, as shown in FIG. 9($b$), when a cell battery (10) is operating in a condition that is not considered to be safe, the master BMS (100) makes an action to prevent further damage to the battery cell (this is its primary protection). For example, a master BMS (100) can communicate with a main protection circuit or circuit breaker to disconnect the battery circuit. Accordingly in the alternative embodiment of the present invention, the protection circuit (600) is also equipped with wireless communication capability. When, for any reason, the master BMS (100) cannot be responsive to the fault signals from slaves (200), the slaves (200) communicate their flag signals (over voltage or under voltage flag) directly with the secondary protection device (SPD) (600) through a wireless channel to protect the battery cells (10). The SPD (600) disclosed includes an RF base station (610), a decision device (620), a controller (630), and an RF antenna (640). The SPD (600) is able to control the main relay or circuit breaker (660) to cut off the main charging/discharging cable to the battery pack (10). While conventional batter pack architectures sometimes employ secondary protection devices with additional wire harnesses, the disclosed WiBaAN only requires an SPD (600) without the additional burden of a wire harness. Moreover, an S-BMU (210) unit can be used for the SPD (600) in a WiBaAN.

Figure 10A:
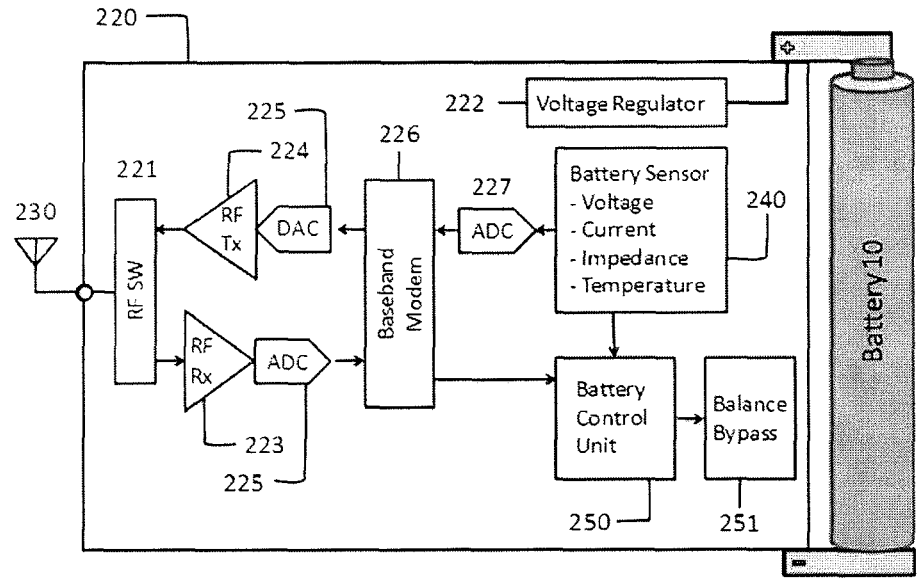
FIG. 10(a) illustrates a block diagram of an S-BMU attached directly to a battery cell.

FIG. 10($a$) is a block diagram showing an S-BMU (210) mounted on a battery cell (10). The S-BMU (210) comprises: a battery sensor unit (240), a complete RF radio (220), an on-board antenna (230), a power management unit (222), a digital signal processing unit (226), and a battery control logic (250). The S-BMU (210) can be implemented with a single silicon chip solution (220) including all the key functional units except an on-board antenna (230) and a crystal. The battery sensor unit (240) includes analog sensors for measuring the voltage, current, impedance, or temperature of the battery cell (10), as well as an analog data multiplexor and high-resolution analog-to-digital converter (227). One of the key features of an S-BMU (210) is to provide a controllability of a battery's balancing and bypassing (251).

Figure 10B:
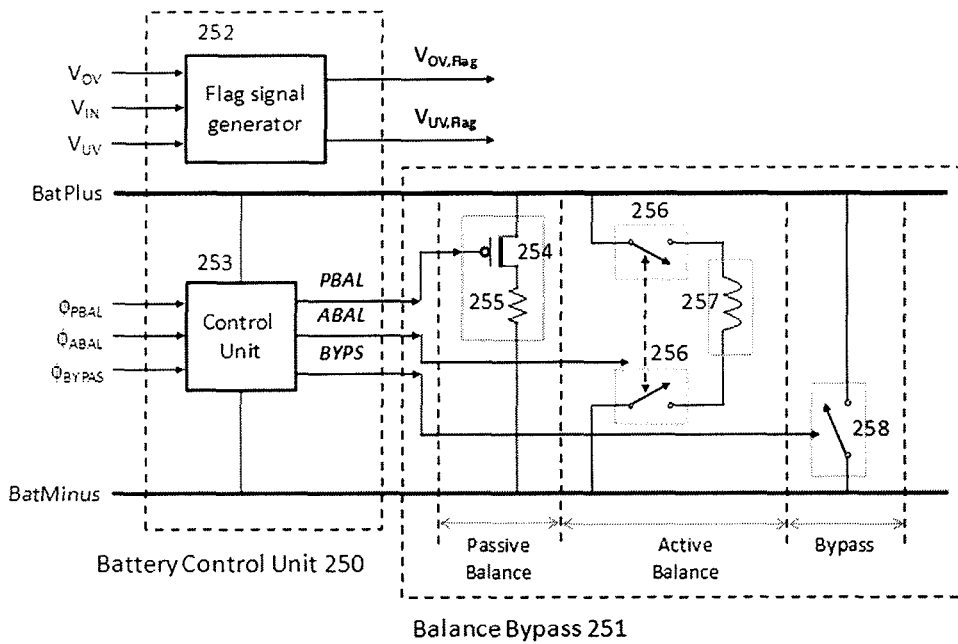
FIG. 10(b) is a detailed block diagram of the battery control logic circuit and a balance and bypass circuit shown in FIG. 10(a) above.

FIG. 10(b) is a block diagram of a battery control logic circuit (250) and a balance and bypass circuit (251). The battery control logic circuit (250) includes an over-voltage and under-voltage flag generation unit (252) and a balance operation control unit (253) for producing the following control signals: passive balance (PBAL); active balance (ABAL); or, bypass control (BPAL). The control commands of balance and bypass are transferred from the M-BMU (100) to the corresponding S-BMU (210), interpreted at the slave baseband modem (226), and delivered to the control logic (250). Passive balance can be implemented several ways including either: 1. at the chip-level with a power MOSFET (254) and a passive resistor (255); 2. at the board-level with external power switch devices and passive elements; or, a combination of internal and external approaches. The active balancing function can be implemented on-board based upon a unique preferred selective cell equalization technique (251). The selective cell equalization technique is performed using an M-BMU (100)'s SoC data. First, the M-BMU (100) delivers an active balance command to the S-BMU (210) that has the highest charging voltage. Second. the extra charge from the S-BMU (210) is delivered to a primary transformer through switch (256) and a secondary transformer (257). Third, the M-BMU (100) selects the battery cell that has the lowest charge and accomplishes active balance by turning the switches (256) on which cause charge redistribution to flow from the primary to the secondary of transformer (257). The control unit (253) is also able to bypass any failed batteries in a series of a battery stacks by controlling the ultra-low on-resistance relay switch (258). Since an S-BMU (210) is mounted on a battery cell (10), directly measured temperature and current data can be mapped into battery environment and operations.

There are various standards for short-range wireless data communication known in the art such as Near Field Communication (NFC), Radio Frequency Identification (RFID), Zigbee, or Bluethooth. They have been successfully deployed in many areas because of low manufacturing cost and small footprints. However, the WiBaAN requires application-driven specific design and specifications over the above mentioned standards because of its demand for variable high-rate data communication and the handling of very dense populations (distribution) of network sensors (200). Even if it resides inside a battery pack covered by a metal case, thereby preventing potential electromagnetic interference (EMI) and electromagnetic compatibility (EMC), the problem remains of highest importance. In addition, the following features should be considered for WiBaAN: variable RF power output, omni-directional built-in antenna, ultra low-power operation, secure QoS, robust operation over wide temperature range, automatic identification of battery distribution, and automatic mode control.

Figure 11:
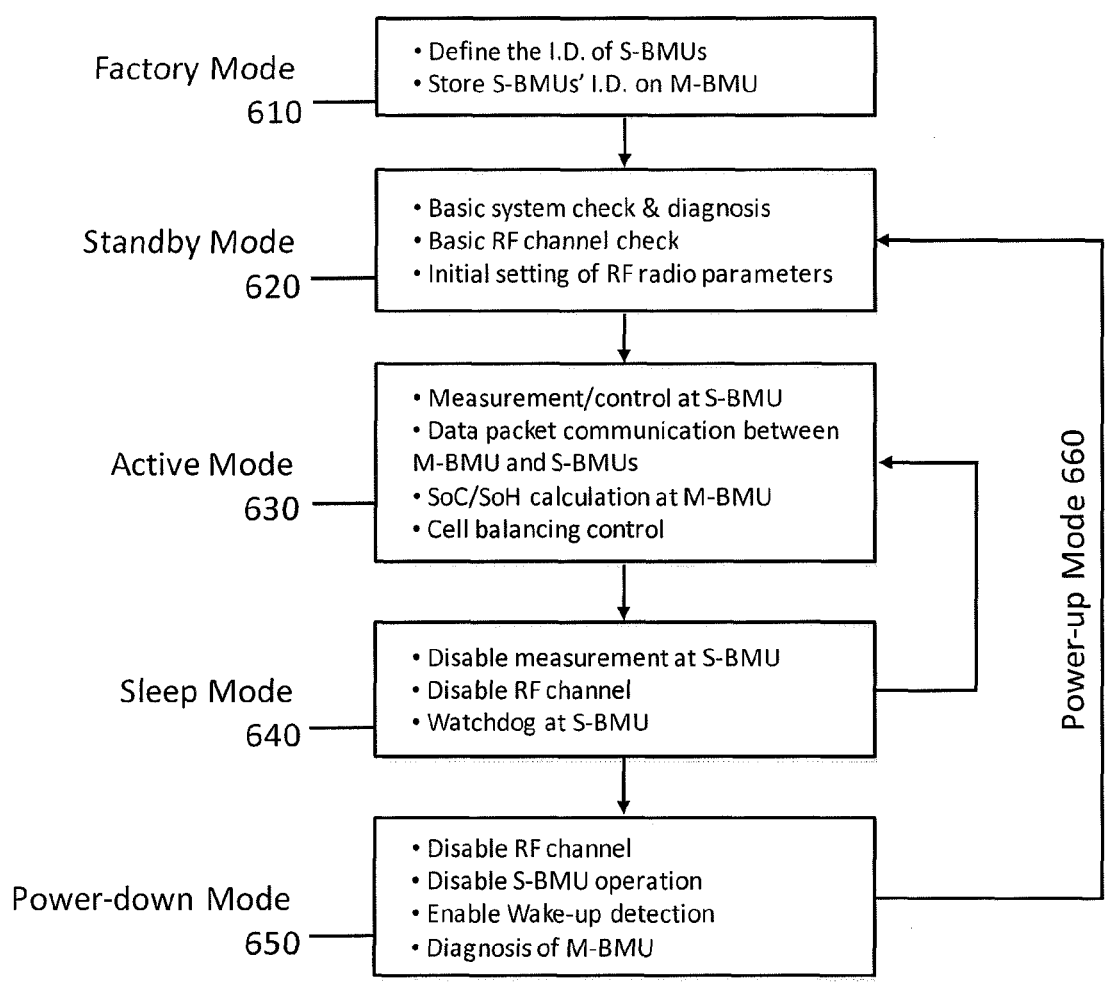
FIG. 11 is a flow diagram of the operation modes of a battery management system according to the present invention.

FIG. 11. illustrates the basic functional flow of the steps required for operating the preferred WiBaAN technology. This is a five-mode process. The factory mode (610) of a WiBaAN is defined with the configuration of each S-BMU's identification (I.D.), by either automatic or scanning approaches, and then it stores all the S-BMUs' I.D.s and battery topology on M-BMU's memory look-up space. When the battery pack (10) is equipped in a system, the WiBaAN devices convert the mode from Factory to Standby mode (620). It attempts to cause both a plurality of S-BMUs (200) and an M-BMU (100) to enter Standby mode (620), which will perform basic system checking and diagnosis, basic RF communication channel checking, and the initial setting of RF radio parameters such as carrier frequency, LO frequency, signal bandwidth and gain, and so on. In Active mode (630), all of the S-BMUs (200) are monitoring their battery operation conditions and communicating with an M-BMU (100) to transfer battery monitor data or to control the battery operation by balancing or bypassing. The M-BMU (100) collects each battery's data sequentially based on predetermined period and sequence, and calculates the SoC and SoH of each battery and its pack. After one S-BMU (210) completes communication with an M-BMU (100), it automatically enters Sleep mode (640), while the next neighboring S-BMU (210) readies to move into Active mode (630). In Sleep mode (640), the S-BMU (210), and the unused building blocks in the RF radio are powered down to save power. After a predetermined time period defined by a watchdog, the S-BMU (210) starts to listen to the packet from the M-BMU (100) in order to wake up again. When the main power switch of the battery pack is turned down, the battery pack enters a power-down mode (650), which disables all the S-BMU (210) functions. During that period the M-BMU (100), which is powered by a dedicated battery, performs diagnosis of the system. A power-up signal (660) generated by M-BMU (100) drives all the S-BMUs (210) to Standby mode (620) from Power-Down mode (650).

In summary, there are several important and unique differences between the WiBaAN of the present invention and other wireless battery monitoring systems. First, the WiBaAN of the present invention involves a unique time-division half-duplex wireless data communication technique employing a frequency-agile, variable data-rate, self-maintaining RF radio architecture. Second, interactions between a BMS controller and a plurality of battery sensors can easily monitor and collect the data of each battery cell's condition, control the charge balancing and bypassing of each battery cell, and maintain a wireless link with a closed control loop. Also, according to the present invention, WiBaAN can be extended to a hierarchical tree architecture so as to handle thousands battery cells in specific applications. Moreover, while the cost for other wireless systems would not be tolerable for cost-sensitive large-scale battery applications, the present invention provides a very cost-effective, single-chip solution. Accordingly, the wireless battery area network (WiBaAN) architecture of the present invention will substantially reduce the cost of Li-Ion battery packs while reliably improving scalability.

While the invention has been described with reference to the preferred embodiment thereof it will be appreciated by those skilled in the art that various modifications can be made to the parts and methods that comprise the invention without departing from the spirit and scope thereof.

The invention claimed is:

1. A wireless battery area network (WiBaAN) system for intelligent battery pack management comprising:
a plurality of master battery management units (M-BMU) (100);
a plurality of sensor battery management units (S-BMU) (210) each connected to at least one corresponding battery cell (10) and at least one sensor (240) configured to monitor said at least one corresponding battery cell (10), wherein each of said S-BMUs (210) is directly connected to and directly controlled by at least one of the plurality of M-BMUs (100) by a first wireless mode;

at least one top level battery management unit (T-BMU) (510) configured to control the operations of the plurality of M-BMUs, wherein said at least one T-BMU is wirelessly connected to each the plurality of M-BMUs (100) by a second wireless mode;

wherein each of the plurality of M-BMUs includes at least one radio device which receives information directly from each S-BMU based on the monitoring, and transmits at least one of balance and bypass control information directly to each of the plurality of S-BMUs based on the received information, and at least one processor device which is configured to determine at least one of a state-of-charge (SoC) and a state-of-health (SoH) of each battery cell based on the information which has been received from each S-BMU, and wherein each of said M-BMUs is configured to transfer at least one of SoC data and SoH data to the T-BMU by using the second wireless mode.

2. The system according to claim 1 further comprising a rebalancing module (250, 251) connected to a plurality of battery cells (10) for rebalancing the charge between said plurality of battery cells (10), wherein whenever a first of the plurality of battery cells (10) reaches approximately a maximum charge its excess charge is automatically redistributed to a second of the plurality of battery cells (10) that is under said maximum charge.

3. The system according to claim 2 wherein said rebalancing module (250, 251) is configured to disconnect a cell (10) from the rest of said system.

4. The system according to claim 1 further comprising:
a secondary protection module (600) configured to wirelessly receive fault signals from said S-BMUs (210) on a condition that said at least one M-BMU (100) is not responsive to fault signals from at least one S-BMU (210), wherein said secondary protection module further configured to operate independently.

5. The system according to claim 4, wherein said fault signals from said S-BMUs (210) include at least one of an indication of over voltage of a battery cell and an indication of under voltage of a battery cell.

6. The system according to claim 1 wherein said battery cells (10) are located in a metal case and S-BMUs (210) are respectively mounted directly on said case.

7. The system according to claim 6 wherein said system further comprises:
a plurality of wireless repeaters (610) attached respectively to individual S-BMUs (210) and configured to wirelessly communicate with said M-BMUs (100) to extend the wireless range of said S-BMUs (210).

8. The system according to claim 1 wherein the at least one sensor (240) measures a condition of said battery cell (10) selected from the group consisting of: voltage, current, impedance and temperature.

9. The system according to claim 1 wherein said first wireless mode is a time division multiplexing (TDM).

10. The system according to claim 9 wherein said second wireless mode is a frequency division multiplexing (FDM).

11. The system according to claim 10 wherein said first and second wireless modes communicate in a duplex fashion.

12. The system according to claim 11 wherein said system has a star network topology.

13. The system according to claim 12 wherein said S-BMU (210) is integrated on a single chip.

14. The system according to claim 1, wherein said first wireless mode is a frequency division mode (FDM) and said second wireless mode is a time division mode (TDM).

* * * * *